United States Patent
Spitsberg et al.

(10) Patent No.: US 6,482,469 B1
(45) Date of Patent: Nov. 19, 2002

(54) METHOD OF FORMING AN IMPROVED ALUMINIDE BOND COAT FOR A THERMAL BARRIER COATING SYSTEM

(75) Inventors: Irene T. Spitsberg, Loveland; Ramgopal Darolia, West Chester, both of OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/546,518

(22) Filed: Apr. 11, 2000

(51) Int. Cl.$^7$ ................................................ C23C 16/06
(52) U.S. Cl. ................... 427/250; 427/255.7; 427/309; 427/376.6
(58) Field of Search ............................. 427/250, 255.7, 427/337, 307, 309, 376.6

(56) References Cited

U.S. PATENT DOCUMENTS

| | | | |
|---|---|---|---|
| 4,414,249 A | | 11/1983 | Ulion et al. |
| 5,645,893 A | * | 7/1997 | Rickerby et al. ............ 427/250 |
| 5,658,614 A | * | 8/1997 | Basta et al. ................. 427/250 |
| 5,866,271 A | * | 2/1999 | Stueber et al. .............. 427/250 |
| 6,074,706 A | * | 6/2000 | Beverley et al. ............ 427/250 |
| 6,255,001 B1 | * | 7/2001 | Darolia et al. .............. 427/250 |

OTHER PUBLICATIONS

Gell et al., *Bond Strength, Bond Stress and Spallation Mechanisms of Thermal Barrier Coatings*, Surface and Coatings Technology 120–121 (1999), pp. 53–60.

* cited by examiner

*Primary Examiner*—Bret Chen
(74) *Attorney, Agent, or Firm*—David L. Narciso; Gary M. Hartman; Domenica N. S. Hartman

(57) ABSTRACT

A thermal barrier coating (TBC) system and method for improving the thermal fatigue life of a thermal barrier coating. The invention entails modifying the surface morphology of an aluminide bond coat that adheres the thermal barrier coating to a substrate of a superalloy component. The aluminide bond coat has columnar grains, such that grain boundaries are exposed at the surface of the bond coat and define ridges. The surface of the bond coat is then treated so that a sufficient amount of material is removed from the grain boundary ridges and other surface peaks to flatten the bond coat surface, i.e., the ridges and peaks are replaced with flattened surfaces that are nearly parallel to the diffusion zone of the bond coat. By removing these surface irregularities, it is believed that a more stable bond coat surface is created where the critical alumina-bond coat interface will exist following a thermal treatment, such as TBC deposition.

22 Claims, 4 Drawing Sheets

METHOD OF FORMING AN IMPROVED ALUMINIDE BOND COAT FOR A THERMAL BARRIER COATING SYSTEM

FIELD OF THE INVENTION

This invention relates to protective coating systems for components exposed to high temperatures, such as the hostile thermal environment of a gas turbine engine. More particularly, this invention is directed to a process for forming an improved aluminide bond coat of a thermal barrier coating system, such as of the type used to protect gas turbine engine components.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack and may not retain adequate mechanical properties. For this reason, these components are often protected by an environmental and/or thermal-insulating coating, the latter of which is termed a thermal barrier coating (TBC) system. Ceramic materials and particularly yttria-stabilized zirconia (YSZ) are widely used as a thermal barrier coating (TBC), or topcoat, of TBC systems used on gas turbine engine components. TBC employed in the highest temperature regions of gas turbine engines is typically deposited by electron beam physical vapor deposition (EBPVD) techniques that yield a columnar grain structure that is able to expand and contract without causing damaging stresses that lead to spallation.

To be effective, TBC systems must have low thermal conductivity, strongly adhere to the article, and remain adherent throughout many heating and cooling cycles. The latter requirement is particularly demanding due to the different coefficients of thermal expansion between ceramic topcoat materials and the superalloy substrates they protect. To promote adhesion and extend the service life of a TBC system, an oxidation-resistant bond coat is often employed. Bond coats are typically in the form of overlay coatings such as MCrAlX (where M is iron, cobalt and/or nickel, and X is yttrium or another rare earth element), or diffusion aluminide coatings. A notable example of a diffusion aluminide bond coat contains platinum aluminide (Ni(Pt)Al) intermetallic. When a bond coat is applied, a zone of chemical interaction occurs within the surface of the superalloy substrate beneath the coating. This zone is typically referred to as a diffusion zone (DZ), and results from the interdiffusion between the coating and substrate. The diffusion zone beneath an overlay bond coat is typically much thinner than the diffusion zone beneath a diffusion bond coat.

During the deposition of the ceramic TBC and subsequent exposures to high temperatures, such as during engine operation, bond coats of the type described above form a tightly adherent alumina ($Al_2O_3$) layer or scale that adheres the TBC to the bond coat. The service life of a TBC system is typically limited by a spallation event brought on by thermal fatigue. Spallation of TBC deposited on MCrAlX bond coats generally occurs within the TBC near the TBC-to-alumina interface, while TBC deposited on diffusion aluminide bond coats typically spall at the alumina-to-bond coat interface or within the alumina layer itself. As a result, the alumina-to-bond coat interface is particularly critical for TBC systems that employ diffusion aluminide bond coats because spallation events often initiate at this interface.

In view of the above, it can be appreciated that bond coats have a considerable effect on the spallation resistance of the TBC, and therefore TBC system life. Consequently, improvements in TBC life have been continuously sought, often through modifications to the chemistries of the bond coat. The effect of the surface finish of MCrAlY bond coats has also been investigated, as evidenced by U.S. Pat. No. 4,414,249 to Ulion et al. The results of this investigation showed that the service life of a columnar TBC can be improved by polishing an MCrAlY bond coat before depositing the TBC. The benefit of improving the surface finish of an MCrAlY bond coat is believed to be that a smoother alumina layer grows, which in turn provides a more uniform surface upon which the columnar TBC is deposited. The initial portion of a columnar TBC consists of many small grains that appear to grow in a competitive fashion, by which more favorably oriented grains eventually dominate less favorably oriented grains. By polishing an MCrAlY bond coat, it is believed that Ulion et al. reduced the number of nucleated grains, thereby reducing growth competition and improving the quality of the TBC adjacent the alumina scale, i.e., in the very region that TBC spallation tends to occur on an MCrAlY bond coat.

As noted above, TBC spallation initiates by a different mechanism on diffusion aluminide bond coats, and primarily along the alumina-bond coat interface. As a result, the toughness of the alumina and the alumina-bond coat interface are most important to TBC deposited on a diffusion aluminide bond coat. From this perspective, polishing a diffusion aluminide bond coat would be expected to reduce TBC life, since sufficient surface roughness of the bond coat would be desired to promote adhesion of the alumina to the bond coat, and to provide a tortuous path that inhibits crack propagation through the alumina and alumina-bond coat interface. As a result, conventional practice has been to grit blast the surface of a diffusion aluminide bond coat to increase its roughness to about 50 microinches (about 1.25 micrometers) Ra or more before depositing the TBC.

BRIEF SUMMARY OF THE INVENTION

The present invention generally provides a method for improving the thermal fatigue life of a thermal barrier coating (TBC) deposited on an aluminide bond coat through a process by which the surface of the aluminide bond coat is modified to eliminate or at least reduce oxidation and oxidation-induced convolutions at the alumina-bond coat interface, as explained more fully below. The bond coat can be a single-phase [(Ni,Pt)Al] or two-phase [$PtAl_2$+(Ni,Pt)Al] diffusion aluminide, though it is believed that overlay aluminide bond coats can also benefit from the teachings of this invention. The invention is particularly directed to aluminide bond coats deposited by methods that produce a generally columnar grain structure, in which grains extend through the additive layer of the bond coat, i.e., from the diffusion zone beneath the additive layer to the bond coat surface, such that grain boundaries are exposed at the bond coat surface. Two widely-used methods that produce bond coats of this character are vapor phase aluminizing (VPA) and chemical vapor deposition (CVD). The surface of a bond coat having columnar grains is characterized by surface irregularities, termed grain boundary ridges, that correspond to locations where grain boundaries meet the bond coat surface.

According to the invention, the spallation resistance of a thermal barrier coating on a diffusion aluminide bond coat is improved by modifying the surface of the bond coat, by which a sufficient amount of material is removed from the grain boundary ridges and other surface peaks to flatten the bond coat surface, i.e., the ridges and peaks are replaced with flattened surfaces that are nearly parallel to the diffusion zone of the bond coat. The invention is particularly directed to flattening the grain boundary ridges formed where the grain boundaries intersect the bond coat surface. By removing these surface irregularities, it is believed that a more stable bond coat surface is created where the critical alumina-bond coat interface will exist following a thermal treatment, such as TBC deposition. Various techniques are believed to be suitable for modifying a diffusion aluminide bond coat surface for purposes of this invention, including controlled polishing, vibrolapping and tumbling techniques.

According to this invention, the original columnar grains of an as-deposited aluminide bond coat were found to be prone to accelerated oxidation at their grain boundaries, with oxidation initiating at the bond coat surface. Unexpectedly, flattened grain boundaries were shown to be much less prone to accelerated oxidation than the original grain boundaries. Surface modification in accordance with this invention also appears to significantly inhibit thermal grooving (the formation of valleys between adjacent grains), and thermal creep that has been determined to initiate and/or rapidly progress at grain boundaries exposed at the bond coat surface. A lower oxidation rate at the grain boundaries may eliminate a cause for the creation of stress concentration sites for enhanced localized creep and oxide crack initiation at the bond coat surface, which are believed to cause the alumina layer to convolute and fracture. Another possibility is that the modified bond coat grain configuration exhibits more stable surface tension conditions, which slow the thermal grooving effect. By eliminating or at least inhibiting the formation of sites where deformation of the alumina layer occurs, and thus where a fracture ultimately initiates and develops with thermal cycling, the spallation life of the TBC adhered by the bond coat is significantly increased.

Also observed with this invention is the development during subsequent thermal treatments of new triangular-shaped grains where grain boundaries originally intersected the surface of the bond coat. These triangular-shaped grains have not been observed to exhibit oxide convolutions found with unmodified diffusion bond coats and associated with spallation events.

Other objects and advantages of this invention will be better appreciated from the following detailed description.

DETAILED DESCRIPTION OF THE INVENTION

Figure 1:
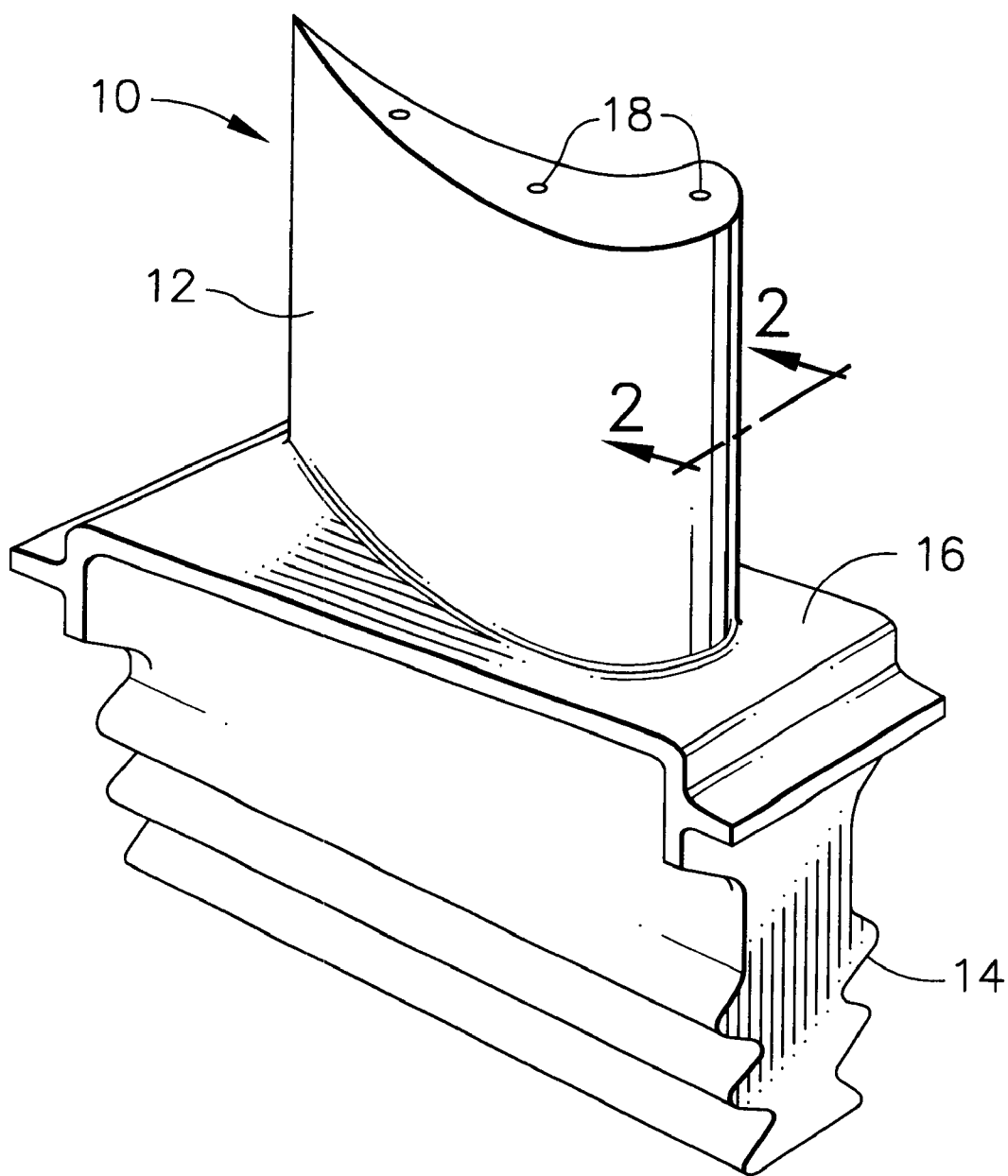
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a TBC system may be used to protect the component from its environment.

Figure 2:
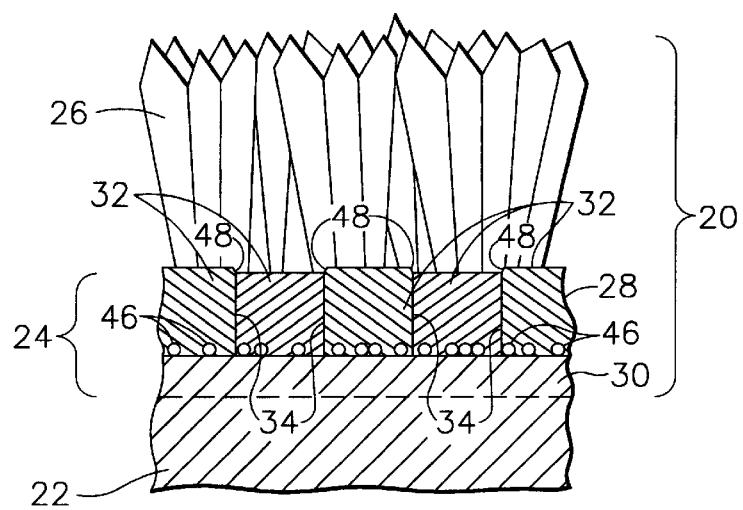
FIG. 2 is a cross-sectional representation of a TBC system on a surface region of the blade of FIG. 1 along line 2—2.

Represented in FIG. 2 is a thermal barrier coating (TBC) system 20 of a type known in the art. As shown, the coating system 20 includes a bond coat 24 overlying a superalloy substrate 22, which is typically the base material of the blade 10. Suitable materials for the substrate 22 (and therefore the blade 10) include equiaxed, directionally-solidified and single-crystal nickel and cobalt-base superalloys. The bond coat 24 is shown as adhering a thermal-insulating ceramic layer 26, or TBC, to the substrate 22. As shown, the ceramic layer 26 has a strain-tolerant columnar grain structure achieved by depositing the ceramic layer 26 using physical vapor deposition techniques known in the art, particularly electron beam physical vapor deposition (EBPVD). A preferred material for the ceramic layer 26 is an yttria-stabilized zirconia (YSZ), a preferred composition being about 3 to about 8 weight percent yttria, though other ceramic materials could be used, such as yttria, nonstabilized zirconia, or zirconia stabilized by magnesia, ceria, scandia or other oxides. The ceramic layer 26 is deposited to a thickness that is sufficient to provide the required thermal protection for the underlying substrate 22. and blade 10, generally on the order of about 75 to about 300 micrometers.

The bond coat 24 is shown as being a diffusion aluminide of a type known in the art. The bond coat 24 is shown as being composed of an additive layer 28 overlying the substrate 22 and a diffusion zone 30 within the surface of the substrate 22. The diffusion zone (DZ) 30 contains various intermetallic and metastable phases that form during the coating reaction as a result of diffusional gradients and changes in elemental solubility in the local region of the substrate 22. The additive layer 28 is typically about 30 to 75 micrometers thick and contains the environmentally-resistant intermetallic phase MAl, where M is iron, nickel or cobalt, depending on the substrate material (mainly β(NiAl) if the substrate is Ni-base). The chemistry of the additive layer 28 is modified by the presence in the aluminum-containing composition of additional elements, such as chromium, silicon, platinum, rhodium, hafnium, yttrium and zirconium. For example, if platinum is deposited on the substrate 22 prior to aluminizing, the additive layer 28 consists of (Pt)NiAl-type intermetallic phases. The bond coat may be a single-phase [(Ni,Pt)Al] or two-phase [PtAl$_2$+ (Ni, Pt)Al] diffusion aluminide includes PtAl intermetallic phases, usually PtAl$_2$ or platinum in solution in the MAl phase.

The bond coat 24 is represented in FIG. 2 as being in an as-deposited condition, i.e., without any additional treatment provided by the present invention. In the as-deposited condition, the additive layer 28 is characterized by grains 32 that extend from the diffusion zone 30 to the surface of the bond coat 24, so that the grains 32 are generally columnar. As also represented, the grains 32 have grain boundaries 34 that intersect the surface of the bond coat 24 at an angle approximately normal to the surface. Those portions of the grain boundaries 34 parallel to the bond coat surface and bordering the diffusion zone 30 are shown as being decorated (pinned) with refractory phases 46 formed during deposition of the bond coat 24 as a result of diffusion of refractory elements from the superalloy substrate 22. Finally, the surface of the bond coat 24 is characterized by surface irregularities, termed grain boundary ridges 48, that correspond to the locations of the grain boundaries 34. The type of microstructure represented in FIG. 2 is typical of aluminide bond coats deposited by chemical vapor deposition (CVD) and vapor phase deposition, e.g., vapor phase aluminizing (VPA).

Figure 3:
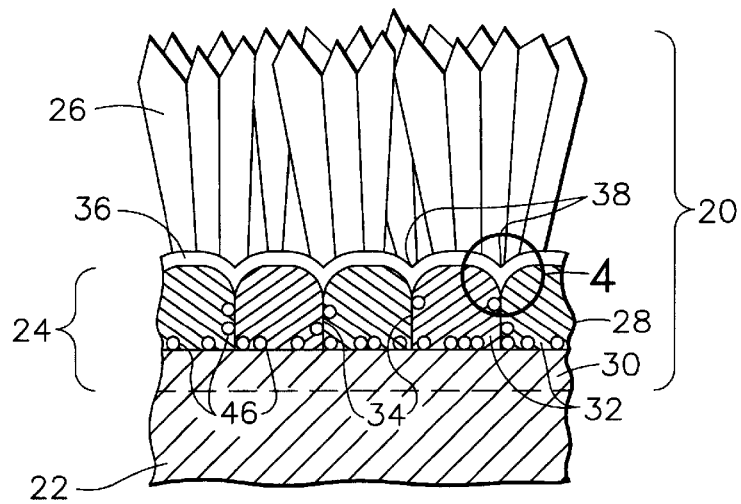
FIGS. 3 through 5 show the progression of a spallation event of the TBC system of FIG. 2.

As depicted in FIG. 3, the aluminum-rich bond coat 24 naturally develops an aluminum oxide (alumina) scale 36 when exposed to an oxidizing atmosphere, such as during high temperature exposures in air. As portrayed in FIGS. 3 and 4, the oxide scale 36 has become convoluted, with valleys 38 present above a majority of the grain boundaries 34 at the bond coat surface. During engine service temperature exposure, the oxide scale 36 continues to grow beneath the permeable ceramic layer 26. Failure of the TBC system 20 during engine service exposure typically occurs by spallation of the ceramic layer 26 from cracks that initiate in the oxide scale 36 and then propagate into the interface between the bond coat 24 and oxide scale 36. Consequently, the strength of this interface, stresses within the interface plane, and changes with temperature exposure influence the life of the TBC system 20.

Figure 4:
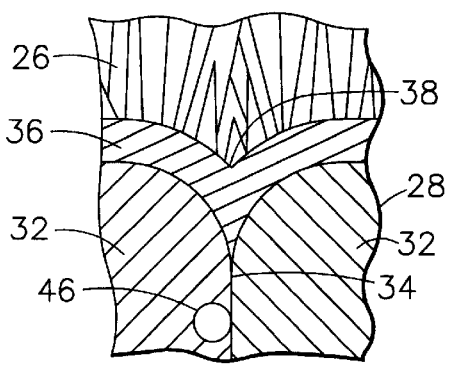
Figure 5:
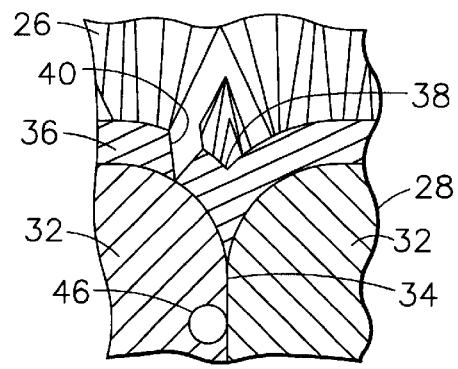
Figure 6:
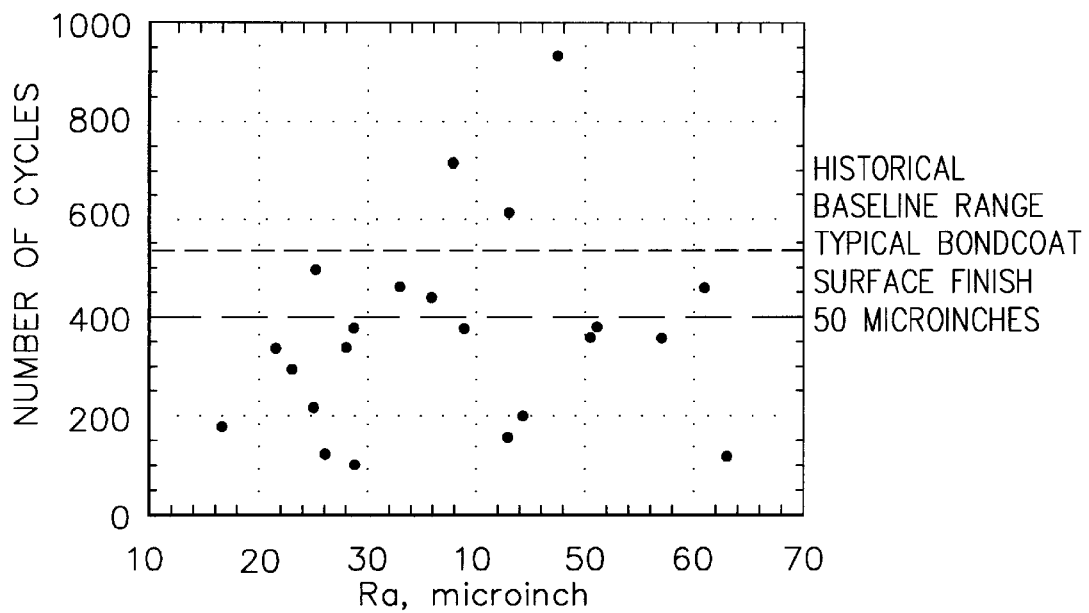
FIG. 6 is a graph that evidences the lack of correlation between the surface roughness of a diffusion aluminide bond coat and TBC spallation life.

During an investigation leading to this invention, superalloy specimens were coated with a TBC system of the type shown in FIG. 2. The superalloy was René N5 with a nominal composition, in weight percent, of 7.5 cobalt, 7.0 chromium, 1.5 molybdenum, 5.0 tungsten, 3.0 rhenium, 6.5 tantalum, 6.2 aluminum, 0.15 hafnium, 0.05 carbon, 0.004 boron, 0.01 yttrium, with the balance nickel and incidental impurities. The bond coats were single-phase PtAl deposited by VPA, while the ceramic topcoats were 7% YSZ deposited by EBPVD. Prior to TBC deposition, the bond coats were finished to achieve surface roughnesses of 12 to 60 microinches (about 0.3 to 1.5 micrometers) Ra using various combinations of polishing and grit blasting. Also tested were René N5 specimens that were not surface treated, and had surface roughnesses of about 50 to 100 microinches (about 1.3 to 2.5 micrometers) Ra. The specimens were furnace cycle tested (FCT) at 2075° F. (about 1135° C.) at one-hour cycles to spallation, and then examined for appearance of the fracture mode that caused spallation. The test results for the treated specimens are plotted in FIG. 6, which evidences that there was no direct correlation between the final surface roughness of the PtAl bond coats and TBC spallation life. Observations made with these specimens evidenced that spallation was brought on by a mechanism that involved convolution of the oxide scale 36, portrayed in FIGS. 3 through 5. The convolutions were observed to typically initiate at the grain boundaries 34, and further developed with oxide growth. Distinct valleys 38 that formed as a result of the scale convolution eventually reached a critical depth/width ratio, at which point the scale 36 was bent at nearly a 90 degree angle (FIG. 4). As represented in FIG. 5, a crack 40 eventually formed in the scale 36 and typically propagated into the bond coat/oxide scale interface. The results for the untreated specimen are not plotted in FIG. 6. However, these specimens generally exhibited the same failure mode, and had FCT lives within or below the baseline range.

From this investigation, it was concluded that TBC spallation on a conventional diffusion aluminide bond coat occurred as a result of cracks developing at steep convolutions in the oxide scale, followed by multiple cracks propagating and linking together to cause an area of TBC to spall. It was also concluded that advanced convolutions which lead to oxide cracking were not associated with the roughness of the bond coat surface. In fact, closer observations made with these specimens suggested that spallation was related to the amount of material removed from the peak points of the bond coat surface, and particularly a decrease in the number of grain boundary ridges, rather than surface roughness. This distinction was particularly evident for the specimen having a surface roughness of about 48 microinches (about 1.2 micrometers) Ra, which exhibited a spallation life of 940 cycles—roughly twice that typically achieved with PtAl bond coats having equivalent surface roughness.

Figure 8:
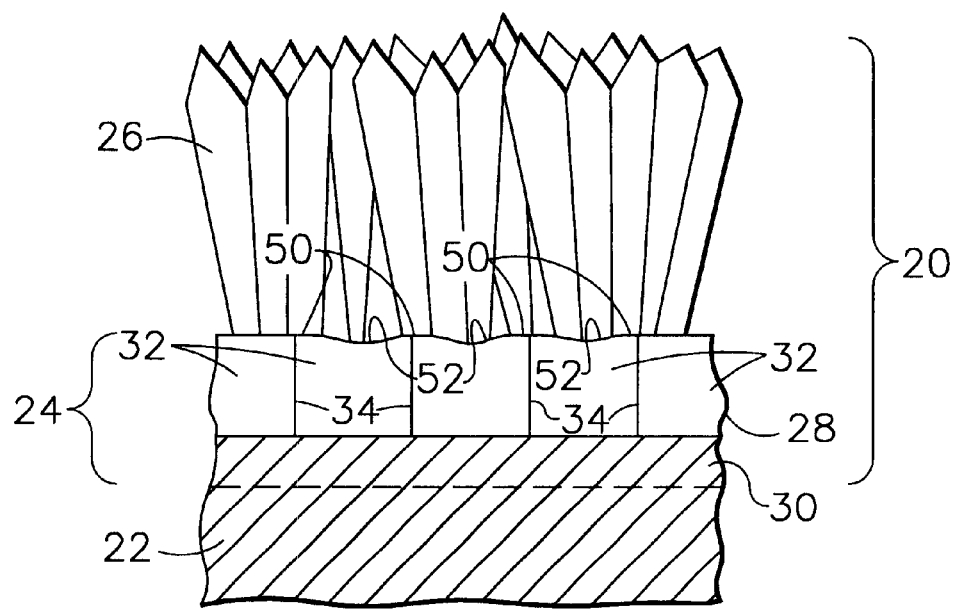
FIGS. 8 and 9 are cross-sectional representations of TBC systems with diffusion aluminide bond coats whose surfaces have been modified to eliminate grain boundary ridges in accordance with this invention.

In view of the above, a second investigation was carried out with four René N5 specimens coated with single-phase PtAl deposited by VPA, and 7% YSZ deposited by EBPVD. Prior to TBC deposition, the bond coats were finished by polishing on a Cyntron-type machine with a 400 gram load and a 1 rpm rotation speed to remove different amounts of material from the surfaces of the bond coats. None of the specimens was fully polished to achieve a mirror surface finish. A resulting TBC system is represented in FIG. 8, which represents that grain boundary ridges 48 of the type shown in FIG. 2 have been removed. In their place, flattened grain boundary surfaces 50 were formed that are substantially parallel to the underlying diffusion zone 30. In this investigation, the removal of material from the bond coat surface peaks was associated with flattening of a fraction of the bond coat surface area, so that with more material removal, a larger percent of the grain boundaries was flattened. As depicted in FIG. 8, dimples or shallow valleys 52 remained in the bond coat surface between some of the flattened grain boundary surfaces 50.

Figure 7:
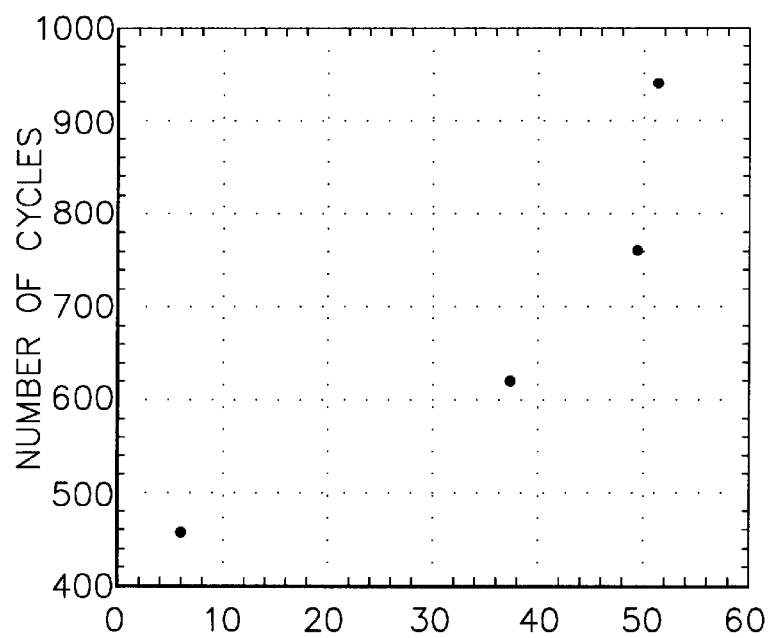
FIG. 7 is a graph that evidences the significant effect that surface material removal from a diffusion aluminide bond coat has on TBC spallation life.

The specimens were then furnace cycle tested (FCT) at 2075° F. (about 1135° C.) at one-hour cycles to spallation. The results of this investigation are plotted in FIG. 7, which evidences that there was a strong correlation between the amount of material removal and spallation resistance, with greater material removal being associated with improved spallation resistance. Again, the explanation for this observation appeared to be that the largest oxide convolutions driving TBC spallation were not associated with bond coat surface roughness, but instead with the degradation of the grain boundaries of the bond coat. Absent from the flattened grain boundary surfaces 50 was the grain boundary degradation represented in FIGS. 3 through 5, in which accelerated grain boundary oxidation resulted in thermal grooving that creates valleys (38 in FIGS. 4 and 5) at the grain boundaries.

Figure 9:
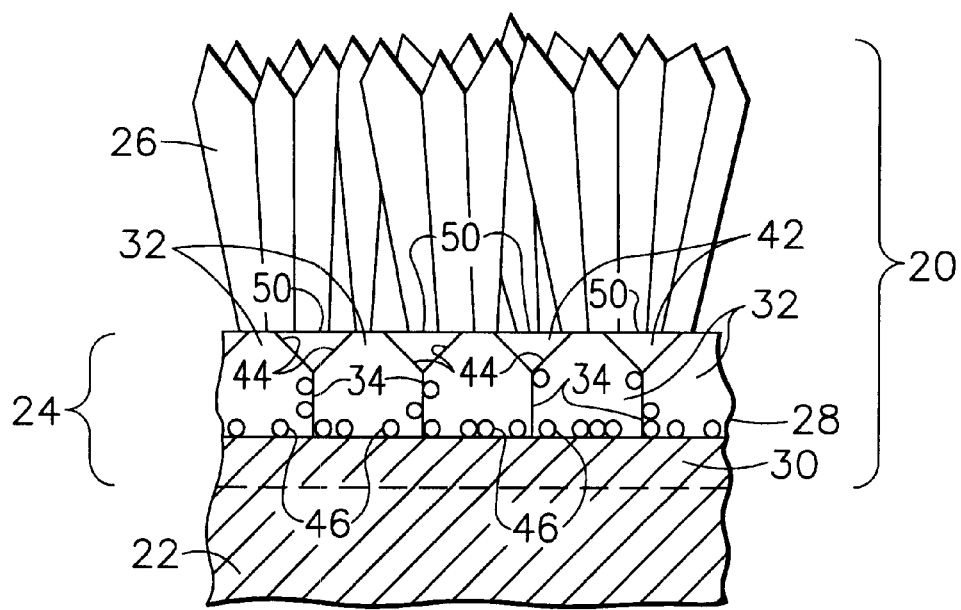

Also observed during the investigation was a rapid formation of new grains 42 that initiated and developed at some of the grain boundary tips during FCT, as represented in FIG. 9. These grains 42 were substantially triangular-shaped, and either formed as gamma prime phase or quickly transformed into the gamma prime phase during cycling. Unexpectedly, the grain boundaries 44 of the new grains 42 did not appear to be susceptible to the accelerated oxidation exhibited by the original grain boundaries (e.g., grain boundaries 34 in FIGS. 2 through 5), nor did convolution of the oxide scale appear to initiate at the new grain boundaries 44. It was therefore concluded that certain properties or characteristics of the original and new grain boundaries were different, and that these differences affected the susceptibility of an aluminide bond coat to oxidation and development of the oxide convolution process.

In view of the above, the present invention provides for the surface modification (smoothing) of diffusion aluminide bond coats to eliminate grain boundary ridges, which yields a surface morphology capable of improving the service life of a TBC adhered to the bond coat. It is believe that surface modification can be performed by various techniques capable of removing surface material without causing material breakage, as occurs with conventional surface treatments such as grit blasting. A preferred technique is to remove up to about ten micrometers of material using relatively gentle surface treatments such as polishing, tumbling and vibrolapping. Based on the test results reported above, it was concluded that spallation life improves with increasing removal of surface material, which in turn eliminates grain boundary ridges, though it is speculated that a significant improvement can be achieved if at least 30% of the grain boundary ridges are removed. Furthermore, at least 40% of the surface area of the bond coat is preferably flat and approximately parallel to the diffusion zone of the bond coat. For example, in FIG. 8, there is an allowance for valleys 52 in the bond coat surface between flattened grain boundary surfaces 50.

Following surface material removal, the bond coat may undergo a stress relief treatment, such as heating to about 1700° F. (about 925° C.) to 2050° F. (about 1120° C.) for about fifteen minutes to two hours, with a preferred Treatment being two hours at about 1925° F. (about 1050° C.). Another optional treatment is to roughen the surface of the bond coat after polishing, using a nonabusive technique such as a mild grit blasting with a wet or dry media of 1200 to 600 grit, preferably 1200 grit, at 80 psi (about 5.5 bar). Importantly, a suitable surface roughening treatment should not damage the flattened grain boundary surfaces 50, and must therefore be gentler that grit blasting techniques (e.g., 60 grit alumina powder at 80 psi) conventionally used to roughen diffusion aluminide bond coats. It appears that such conventional grit blasting methods cause breakage of material at the grain boundaries along certain crystallographic planes, resulting in the formation of defects that act as degradation sites similar to the grain boundary ridges that the present invention seeks to reduce.

While the invention has been described in terms of a preferred embodiment, it is apparent that other forms could be adopted by one skilled in the art. Therefore, the scope of the invention is to be limited only by the following claims.

What is claimed is:

1. A method of improving the thermal fatigue life of a thermal barrier coating by modifying the surface morphology of a diffusion bond coat that adheres the thermal barrier coating to a surface of a superalloy component, the method comprising the steps of:

depositing the bond coat on the component so as to be characterized by substantially columnar grains that extend substantially through that portion of the bond coat overlying the surface of the component, the grains having grain boundaries exposed at the surface of the bond coat, the grain boundaries defining grain boundary ridges at the surface of the bond coat;

removing material from the surface of the bond coat to flatten at least some of the grain boundary ridges and thereby form flattened grain boundary surfaces; and then depositing the thermal barrier coating on the bond coat.

2. A method according to claim 1, wherein at least 30% of the grain boundary ridges are flattened during the removal step.

3. A method according to claim 2, wherein substantially all of the grain boundary ridges are flattened during the removal step.

4. A method according to claim 1, wherein the removing step forms valleys that remain in the surface of the bond coat between adjacent flattened grain boundary surfaces.

5. A method according to claim 1, wherein after the removal step at least 40% of the surface area of the bond coat is approximately parallel to a diffusion zone of the bond coat in the surface of the component.

6. A method according to claim 1, wherein up to ten micrometers of the surface of the bond coat is removed during the removal step.

7. A method according to claim 1, wherein material is removed from the surface of the bond coat by polishing, tumbling or vibrolapping.

8. A method according to claim 1, further comprising the step of heating the bond coat after depositing the thermal barrier coating to cause new grains to form at the surface of the bond coat where grain boundary ridges were removed.

9. A method according to claim 8, wherein the bond coat is heated to a temperature of about 925° C. to about 1120° C. for at least fifteen minutes.

10. A method according to claim 8, wherein the new grains are substantially triangular in shape.

11. A method according to claim 1, wherein the bond coat is a single-phase aluminide.

12. A method according to claim 1, wherein the bond coat is a two-phase aluminide.

13. A method according to claim 1, wherein the bond coat is a diffusion aluminide bond coat.

14. A method according to claim 1, wherein the bond coat is deposited on the component by vapor phase aluminizing or by chemical vapor deposition.

15. A method of improving the thermal fatigue life of a thermal barrier coating by modifying the surface morphology of a diffusion platinum aluminide bond coat that adheres the thermal barrier coating to a surface of a superalloy component, the method comprising the steps of:

depositing the platinum aluminide bond coat on the component by vapor phase aluminizing or by chemical vapor deposition, the bond coat comprising an additive layer on the surface of the component and a diffusion zone in a surface region of the component, the additive layer being characterized by columnar grains that extend from the diffusion zone to the surface of the bond coat the grains having grain boundaries exposed at the surface of the bond coat;

removing up to ten micrometers of material from the surface of the bond coat to flatten at least 30% of the grain boundary ridges and yield flattened grain boundary surfaces;

heat treating the bond coat; and depositing the thermal barrier coating on the surface of the bond coat during or after heat treating the bond coat.

16. A method according to claim 15, wherein after the removal step at least 40% of the surface area of the bond coat is approximately parallel to the diffusion zone.

17. A method according to claim 15, wherein the removing step forms valleys that remain in the surface of the bond coat between flattened grain boundary surfaces.

18. A method according to claim 15, wherein material is removed from the surface of the bond coat by polishing, tumbling or vibrolapping.

19. A method according to claim 15, wherein during the heat treating step, substantially triangular-shaped grains form at the surface of the bond coat where grain boundary ridges were removed.

20. A method according to claim 15, wherein the bond coat is heated to a temperature of about 925° C. to about 1120° C. for at least fifteen minutes during the heat treating step.

21. A method according to claim 15, wherein the bond coat is a single-phase aluminide.

22. A method according to claim 15, wherein the bond coat is a two-phase aluminide.

* * * * *